(12) United States Patent
Fu et al.

(10) Patent No.: US 8,169,546 B2
(45) Date of Patent: May 1, 2012

(54) TECHNIQUE FOR TUNER AUTOMATIC GAIN CONTROL CIRCUIT FOR MOBILE TELEVISION APPLICATIONS

(75) Inventors: Xiaoyu Fu, Irvine, CA (US); Jun Ma, Irvine, CA (US); Waleed M. Younis, Foothill Ranch, CA (US); Nabil Yousef, Foothill Ranch, CA (US); Janakan Sivasubramaniam, Irvine, CA (US); Edward Youssoufian, Irvine, CA (US)

(73) Assignee: Newport Media, Inc., Lake Forest, CA (US)

( * ) Notice: Subject to any disclaimer, the term of this patent is extended or adjusted under 35 U.S.C. 154(b) by 1108 days.

(21) Appl. No.: 12/033,323

(22) Filed: Feb. 19, 2008

(65) Prior Publication Data

US 2009/0207311 A1   Aug. 20, 2009

(51) Int. Cl.
  *H04N 5/52*     (2006.01)
  *H04N 3/27*     (2006.01)
  *H04N 5/00*     (2011.01)
  *H04N 5/44*     (2011.01)
  *H04B 1/40*     (2006.01)
  *H04B 17/02*    (2006.01)
  *H04B 1/06*     (2006.01)
  *H04B 7/00*     (2006.01)
  *H04B 1/26*     (2006.01)
  *H04B 1/00*     (2006.01)
  *H04L 27/06*    (2006.01)
  *H04L 17/08*    (2006.01)

(52) U.S. Cl. ........ 348/678; 348/554; 348/607; 348/618; 348/725; 455/20; 455/85; 455/138; 455/234.1; 455/250.1; 455/323; 375/150; 375/344; 375/345

(58) Field of Classification Search .................. None
  See application file for complete search history.

(56) References Cited

U.S. PATENT DOCUMENTS

| | | | | |
|---|---|---|---|---|
| 2002/0172313 A1* | 11/2002 | Smith et al. | ................. | 375/376 |
| 2003/0064695 A1* | 4/2003 | Shi | ................. | 455/302 |
| 2003/0153289 A1* | 8/2003 | Hughes et al. | ................. | 455/138 |
| 2004/0004674 A1* | 1/2004 | Birleson | ................. | 348/731 |
| 2006/0055824 A1* | 3/2006 | Zhu et al. | ................. | 348/554 |
| 2006/0222116 A1* | 10/2006 | Hughes et al. | ................. | 375/345 |
| 2006/0222118 A1* | 10/2006 | Murthy et al. | ................. | 375/345 |

* cited by examiner

*Primary Examiner* — Joseph P Hirl
*Assistant Examiner* — Mary A Kay
(74) *Attorney, Agent, or Firm* — Rahman LLC (57) ABSTRACT

A technique for providing stable tracking performance to an AGC loop circuit comprises amplifying a wideband radio frequency signal; detecting signals and blockers adjacent to the radio frequency signal; lowering a gain of the radio frequency signal; mixing a local oscillator signal with the radio frequency signal; shifting a frequency of the radio frequency signal from a radio frequency to an intermediate frequency; continuously varying a gain of the intermediate frequency signal; converting the intermediate frequency signal into a digital output signal; comparing the digital output signal with predefined thresholds comprising an upper threshold and a lower threshold; switching a post mixer amplifier (PMA) to a high gain state when an input of a variable gain amplifier (VGA) is greater than the upper threshold, and switching the PMA to a low gain state when an input of the VGA is lower than the lower threshold.

20 Claims, 6 Drawing Sheets

TECHNIQUE FOR TUNER AUTOMATIC GAIN CONTROL CIRCUIT FOR MOBILE TELEVISION APPLICATIONS

BACKGROUND

1. Technical Field

The embodiments herein generally relate to electrical circuits for gain control, and, more particularly, to automatic gain control (AGC) loop circuits.

2. Description of the Related Art

In a wireless communication environment, a tuner is provided in receivers such as radios and televisions to tune to a channel selected by a user. The tuner typically comprises a mixer that mixes the received radio frequency (RF) signal with a local oscillator (LO) signal having a frequency corresponding to a selected channel. The output of the mixer is a predetermined intermediate frequency signal. In such cases, a radio signal received by the receiver varies with time as the receiver's location changes. Such changes may lead to compression in the tuner or loss of sensitivity.

As a result, maintaining a correct level of the radio signal is important for proper receiver design. First, the input signal must be at the correct level before entering an analog-to-digital converter (ADC) to reduce the dynamic range of the ADC. Dynamic range refers to the ratio of a maximum level of a parameter, such as voltage or frequency, to the minimum detectable value of the parameter. If the input signal level is either too big or too small then the ADC output signal will be either clipped or rounded.

Generally, both clipping and rounding of the output signal will significantly degrade the signal quality and performance of a system. Second, the input signal level before each amplifier should be at the correct level to keep the amplifiers' linearity. Mobile digital television standards such as Digital Video Broadcasting-Handheld (DVB-H), Terrestrial Integrated Services Digital Broadcasting (ISDB-T), and MediaFLO™ mobile multimedia multicast system available from Qualcomm, Inc., California, USA use Orthogonal Frequency Division Multiplexing (OFDM) which is assumed as an effective digital modulation scheme for transmitting data at high rate in many wireless applications, where the radio signals are split into multiple smaller sub-signals that are then transmitted simultaneously at different frequencies to the receiver. OFDM has many advantages such as high spectrum efficiency, robustness at multi-path channels and high frequency diversity gain. On the other hand, OFDM also has disadvantages such as a high peak to average power ratio (PAPR) (e.g., usually 12~14 dB) and high sensitivity to inter carrier interference (ICI).

Terrestrial television and radio broadcast networks tend to have large blocker signals covering broad service areas. In such cases, the receiver typically has to be very linear. In other words, the output generally must have a linear relationship with the input, to maintain the performance of the receiver. Blocker signals are unwanted signals in frequency channels outside the wanted channel that disturb the reception of the wanted signals. This happens due to the fact that the blockers generate large signals within the receiver path. Generally, it is difficult to achieve optimal performance for a wide frequency range in the presence of blocker signals which cannot be filtered.

SUMMARY

In view of the foregoing, an embodiment herein provides a mobile television (TV) receiver comprising an AGC loop circuit, wherein the AGC loop circuit comprises a RF AGC control loop comprising a low noise amplifier (LNA) adapted to amplify a wideband radio frequency signal; a received signal strength indication (RSSI) unit adapted to detect signals and blockers adjacent to the radio frequency signal; and a RF AGC control unit adapted to lower a gain of the radio frequency signal; a mixer adapted to mix a LO signal with the radio frequency signal; and an intermediate frequency (IF) AGC control loop comprising a bandpass filter adapted to filter additional signal blockers adjacent to the radio frequency signal; a post mixer amplifier (PMA) adapted to amplify an input signal of the PMA, wherein the PMA comprises a high gain state and low gain state; a variable gain amplifier (VGA) adapted to continuously vary a gain of an intermediate frequency signal; an analog-to-digital converter (ADC) adapted to convert the intermediate frequency signal into a digital output signal; and an intermediate frequency AGC control unit adapted to feed the digital output signal to the PMA and to compare the digital output signal with predefined thresholds comprising an upper threshold and a lower threshold, wherein the PMA is switched to the high gain state when an input of the VGA is greater than the upper threshold, and wherein the PMA is switched to the low gain state when an input of the VGA is lower than the lower threshold.

Preferably, the RSSI process unit is adapted to down sample and perform signal processing of the output signal of the LNA. The RF AGC control loop preferably comprises a bandwidth of approximately 10 Hz, and the IF AGC control loop preferably comprises a bandwidth of approximately 400 Hz. Moreover, the RF AGC control unit may be adapted to strengthen an output signal of the RSSI process unit, and wherein the RSSI process unit may be adapted to reduce compression in the output amplified signal of the LNA.

Another embodiment provides a method of providing stable tracking performance to an AGC loop circuit, the AGC loop circuit comprising (i) a RF AGC control loop having a LNA and a RSSI, and (ii) an intermediate frequency AGC control loop comprising a bandpass filter, a PMA, and a VGA, wherein the method comprises amplifying a wideband radio frequency signal; detecting signals and blockers adjacent to the radio frequency signal; lowering a gain of the radio frequency signal; mixing a LO signal with the radio frequency signal; shifting a frequency of the radio frequency signal from a radio frequency to an intermediate frequency; continuously varying a gain of the intermediate frequency signal; converting the intermediate frequency signal into a digital output signal; comparing the digital output signal with predefined thresholds comprising an upper threshold and a lower threshold; switching the PMA to a high gain state when an input of the VGA is greater than the upper threshold, and switching the PMA to a low gain state when an input of the VGA is lower than the lower threshold.

The method may further comprise down sampling the radio frequency output from the LNA and performing signal processing of the radio frequency signal output from the LNA. Preferably, the RF AGC control loop comprises a bandwidth of approximately 10 Hz. Moreover, the intermediate frequency AGC control loop preferably comprises a bandwidth of approximately 400 Hz. Also, the bandwidth of the radio frequency AGC control loop and the intermediate frequency AGC control loop may be programmable to obtain a tracking performance of the AGC loop circuit.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which.

DETAILED DESCRIPTION OF PREFERRED EMBODIMENTS

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

Figure 1:
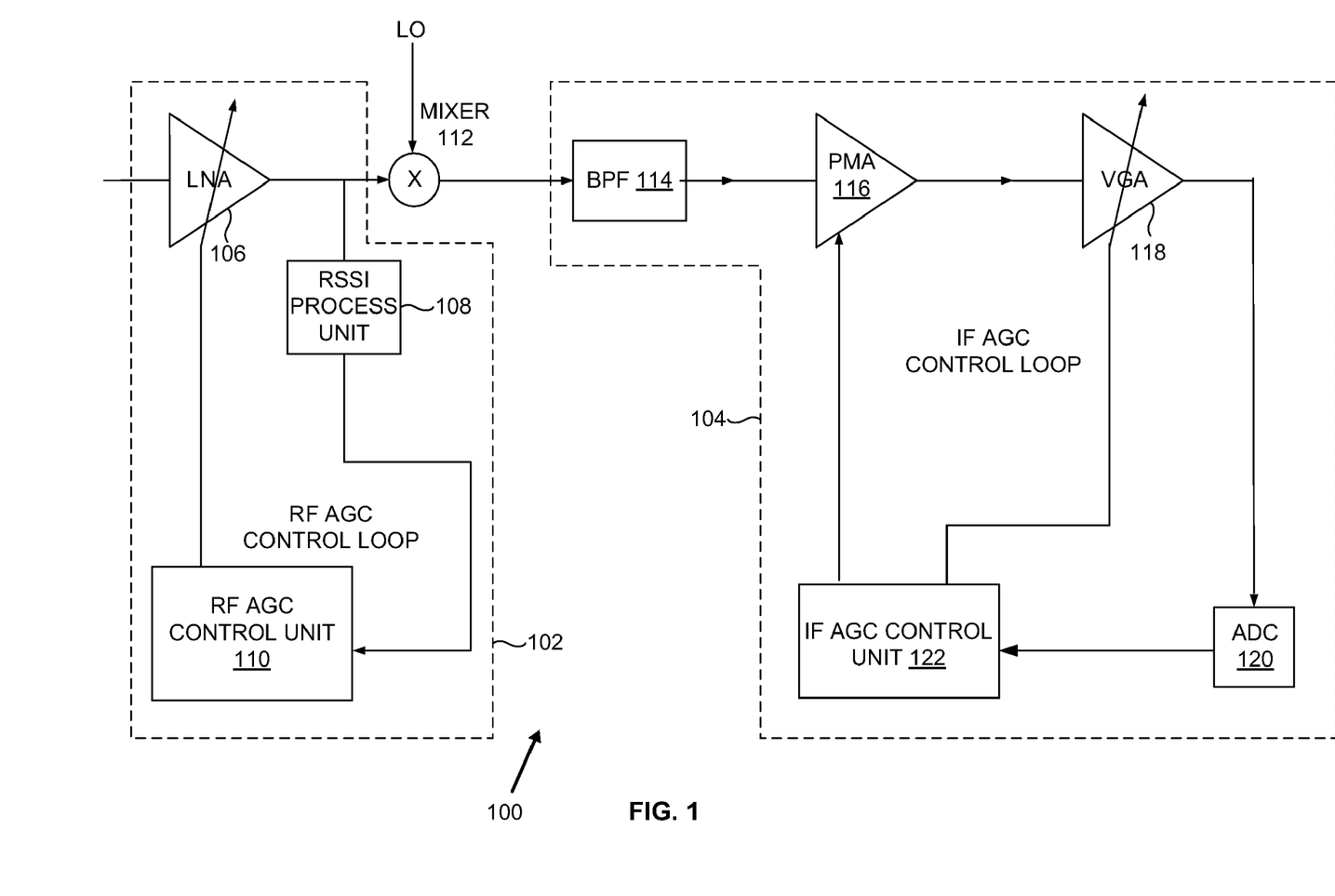
FIG. 1 illustrates a block diagram of AGC control loop circuit having a radio frequency AGC loop and an intermediate frequency AGC loop according to an embodiment herein.

Referring now to the drawings, and more particularly to FIGS. 1 through 5, where similar reference characters denote corresponding features consistently throughout the figures, there are shown preferred embodiments. FIG. 1 illustrates a block diagram of an AGC control loop circuit 100 having a RF AGC loop 102 and an IF AGC loop 104, which may be part of a tuner, according to an embodiment herein. The RF loop 102 includes a low noise amplifier (LNA) 106, a RSSI process unit 108, and a RF AGC unit 110 according to the embodiment herein. The LNA 106 receives an input signal (e.g., a wideband radio frequency). The RSSI process unit 108 is connected to the LNA 106.

The RSSI process unit 108 provides the power measurement of the wideband RF signal. In a preferred embodiment, the RSSI process unit 108 reduces compression of the output signal of the LNA 106. The RF AGC unit 110 receives the output signal from the RSSI process unit 108. The RF AGC unit 108 turns down the gain of the LNA 106 and prevents compression in the LNA 106. The IF AGC control loop 104 includes a mixer 112, a bandpass filter (BPF) 114, a post mixer amplifier (PMA) 116, a variable gain amplifier (VGA) 118, an ADC 120 and a IF AGC control unit 122 according to an embodiment herein.

The mixer 112 mixes signals and sends the signals to the BPF 114. In an example embodiment, the mixer 112 may receive the amplified wideband RF signal from the LNA 106 and mixes the received signal with a local oscillator (LO) signal to produce an output containing mixture of both signals. The output signal (mixed signals) may have the sum or difference of the frequency of the signals. The BPF 114 receives the signal and filters the unwanted adjacent blocking signals. In addition, the BPF 114 passes a frequency within a range of the desired signal. The PMA 116 is connected to the BPF 114. The PMA 116 amplifies the desired signal (input signal fed to the PMA 116).

The VGA 118 is connected to the PMA 116. The VGA 118 varies the gain of an input signal received from the PMA 116. The ADC 120 receives an input signal from the VGA 118 and converts said the signal to a digital output signal. The IF AGC control unit 122 receives the digital output signal (without large adjacent blockers). The IF AGC control unit 122 compares the digital output signal with the predefined thresholds.

Figure 2A:
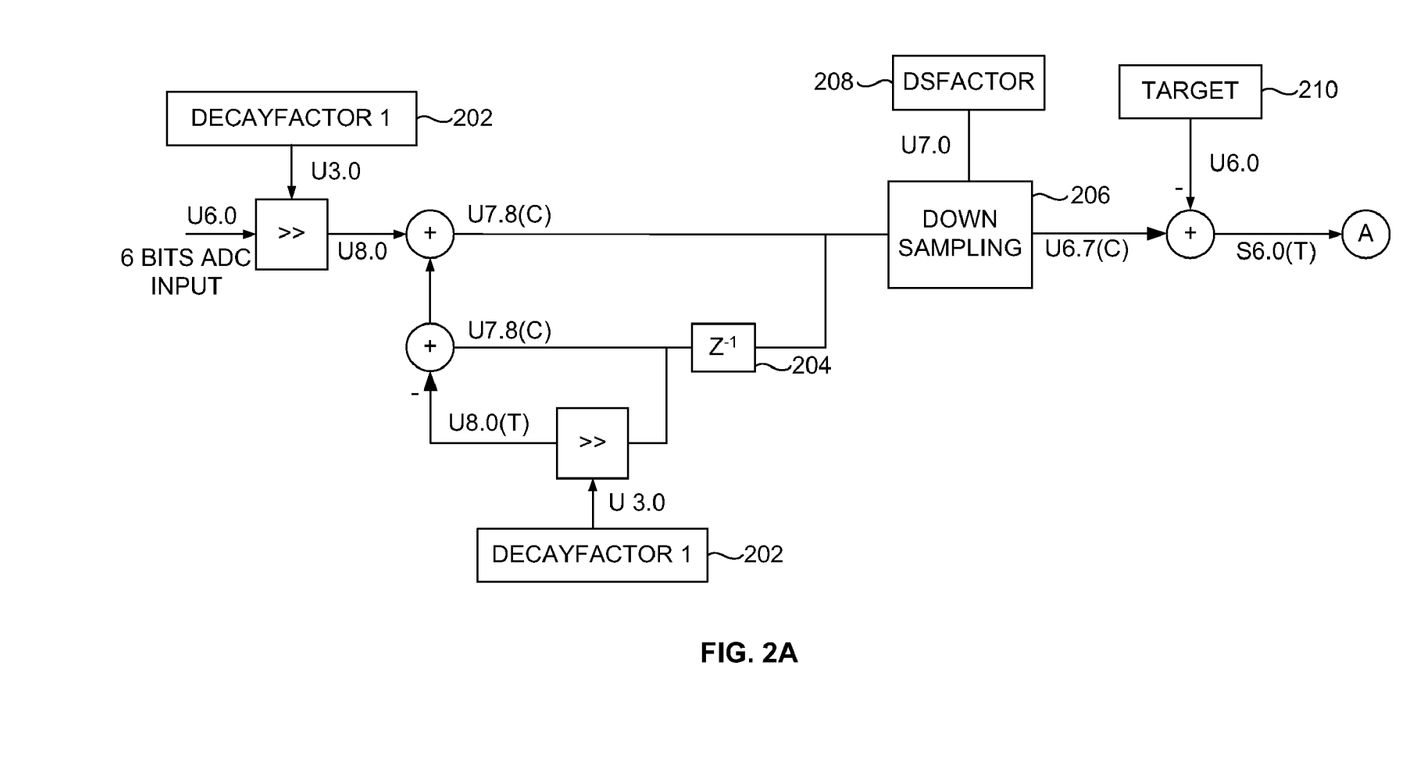
FIGS. 2A and 2B illustrates are block diagram of the Received Signal Strength Indication (RSSI) process unit and the RF AGC control loop according to an embodiment herein.
Figure 2B:
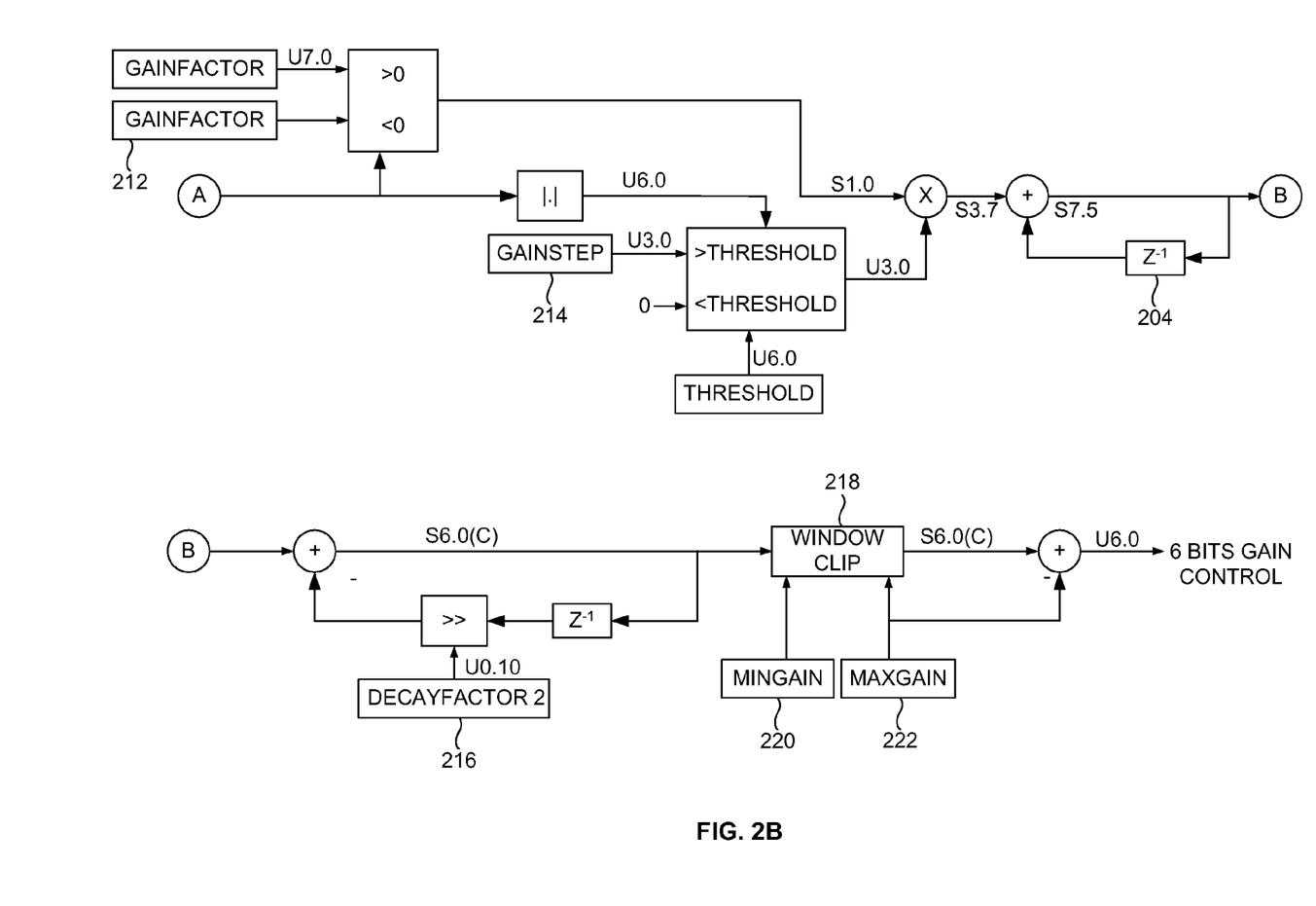

FIGS. 2A and 2B illustrate diagrams of the RSSI process unit 108 and the RF AGC control loop 102 according to an embodiment herein. In FIGS. 2A and 2B, "S" refers to a signed number and "U" refers to an unsigned number. For example, "S1.0" represents a 2-bit signed number with a sign bit with a 1-bit integer part and a 0-bit fraction part. As another example, "U3.0" refers to a 3-bit unsigned number with a 3-bit integer part and a 0-bit fraction part. A 6-bit ADC input signal of U6.0 with a first (decay factor 1) 202 of U3.0 is passed to eliminate distortion in the processing input signal. The input signal with U0.8 is then processed to a Z inverse transform ($Z^{-1}$) 204 through a feedback loop and simultaneously for down sampling 206. The Z inverse transform ($Z^{-1}$) 204 converts a complex frequency-domain representation of the signal into a discrete time-domain signal, which is a sequence of real numbers S7.5. Down sampling 206 is the process of reducing the sampling rate of the input signal. This is usually performed to reduce the data rate or the size of the data in the input signal. A down sampling factor 208 is usually an integer or a rational fraction (U7.0). The down sampling factor 208 multiplies the sampling time or, equivalently, divides the sampling rate to achieve a target 210 of U6.0. The down sampling factor is programmable through external registers (not shown). The input signal is then compared with a gain factor 212. The gain factor 212 is a ratio of a digital signal peak to maximum. The gain factor 212 is applied to the entire signal to bring the peak level to the level of a desired signal to perform signal processing.

In an example embodiment, the desired signal is compared with the gain factor U0.7, whether if the input signal is greater than zero (0) or less than zero (0). The gain factor 212 is typically adapted to suppress the additive noise (e.g., large adjacent block). In another embodiment, the desired signal is also passed to the gain step 214. The gain step 214 includes two predefined thresholds U3.0 and 0. The desired signal (input signal) is compared with the two predefined thresholds U3.0 and 0 and is multiplied with the signal of the gain factor 212 S1.0. The Z inverse transform ($Z^{-1}$) 204 converts a complex frequency-domain representation of the signal into a discrete time-domain signal, which is a sequence of real numbers S7.5. The input signal s6.0 is then further passed to a window clip 218 and simultaneously to a second decay factor (decay factor 2) 216 U0.10 thus eliminating distortion in the processing input signal if any by providing a feedback loop. Decay factor 1 and decay factor 2 are used to control the loop convergence rate and tracking accuracy. They are programmable through external registers (not shown) with pre-programmed values.

The window clip 218 compares the incoming input signal gain with a min gain 220 and a max gain 222. If the input signal gain is lower than the min gain 220 or higher than the max gain 222, the window clip 216 clips a certain amount of the input signal. For example, the amount that is clipped is the difference between the gain and the min gain 220, or the amount that is clipped is the difference between the gain and the max gain 222. Hence, the desired output signal is a 6-bit gain control u6.0. In a preferred embodiment (in reference to FIG. 1), the RF AGC control loop 102 has a bandwidth of 10 Hz. The input signal (OFDM signal) received by the low noise amplifier 104 has a high peak to average power (PAPR) usually in the range of approximately 12-14 dB. This signal is fed as the input to the RSSI process unit 108. The RSSI process unit 108 filters the input samples and obtains a stable power from the incoming wideband RF signal. In addition, the decay factor 2 is programmable to balance the fast acquisition and stable tracking performance.

Figure 3:
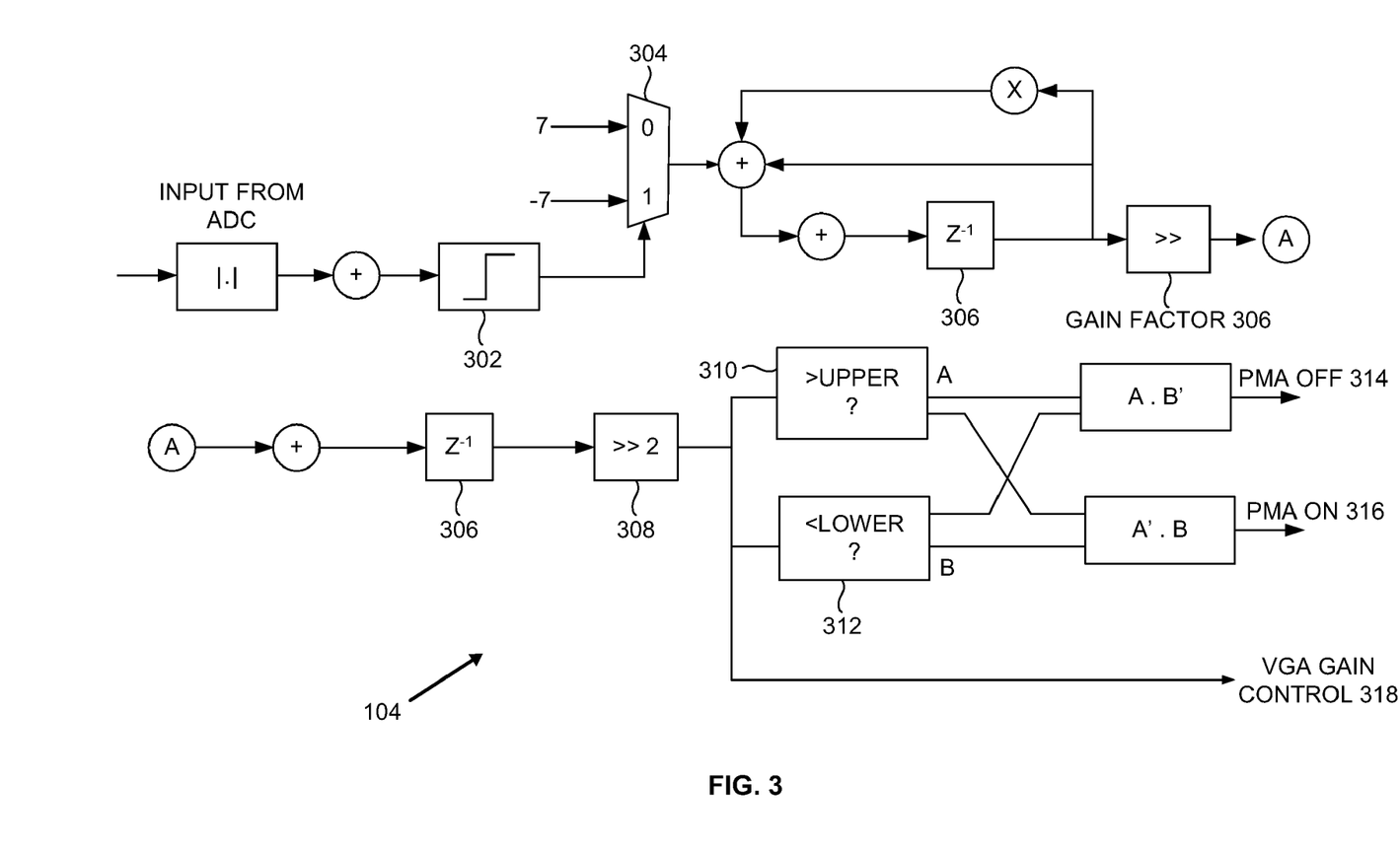
FIG. 3 illustrates an exploded view of the Intermediate Frequency (IF) AGC control loop according to an embodiment herein.

FIG. 3, with reference to FIGS. 1 through 2B, illustrates a detailed diagram of the IF AGC control loop 104 of FIG. 1 according to an embodiment herein. The IF AGC control loop 104 has a bandwidth of 400 Hz. The desired signal (without blocker) is fed from the ADC 120. The IF AGC control loop 104 includes two predefined thresholds 304 (e.g., an upper threshold and a lower threshold). The upper threshold is 0 and the lower threshold is 1. In a preferred embodiment, the upper threshold ranges to +7 and the lower threshold ranges to −7. For the variable gain amplifier control, a normal tracking loop is applied. The input signal of the VGA 118 is added with a square wave signal 302 and is compared with the predefined thresholds 304 (e.g., the upper threshold and the lower threshold) for the PMA 116 control. The Z inverse transform ($Z^{-1}$) 306 simplifies to the inverse discrete-time Fourier transform.

The Z inverse transform ($Z^{-1}$) 306 converts a complex frequency-domain representation into a discrete time-domain signal, which is a sequence of real numbers. The signal is compared with the gain factor 212. The desired signal (input signal) is compared with a value 308 of greater than two. The PMA 116 includes a turn ON state 314 and a turn OFF state 316. In the preferred embodiment, if the input signal of the VGA 118 is higher 310 than the upper threshold, then the PMA 116 is turned ON 316. If the input signal of the VGA 118 is lower 312 than the lower threshold, then the PMA 116 is turned OFF 314. If the input signal is a desired signal having a correct threshold, then the desired signal is received by the VGA gain control 318.

The embodiments herein can include both hardware and software elements. The embodiments that are implemented in software include but are not limited to, firmware, resident software, microcode, etc. Moreover, the techniques provided by the embodiments herein may be implemented on an integrated circuit chip (not shown). The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Figure 4:
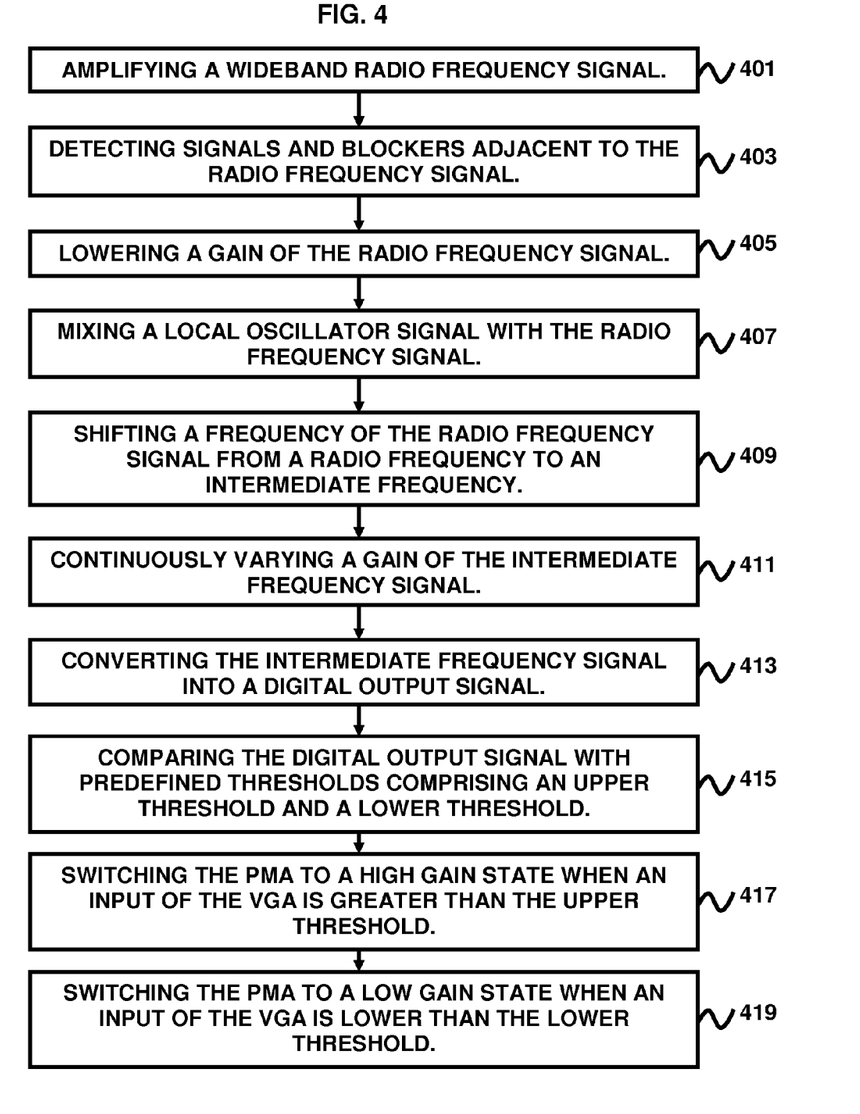
FIG. 4 is a flow diagram illustrating a preferred method according to an embodiment herein.

FIG. 4, with reference to FIGS. 1 through 3, is a flow diagram illustrating a method of providing stable tracking performance to an AGC loop circuit 100 comprising (i) a RF AGC control loop 102 having a LNA 106 and a RSSI 108, and (ii) an IF AGC control loop 104 comprising a BPF 114, a PMA 116, and a VGA 118, wherein the method comprises amplifying (401) a wideband radio frequency signal; detecting (403) signals and blockers adjacent to the radio frequency signal; lowering (405) a gain of the radio frequency signal; mixing (407) a LO signal with the radio frequency signal; shifting (409) a frequency of the radio frequency signal from a radio frequency to an intermediate frequency; continuously varying (411) a gain of the intermediate frequency signal; converting (413) the intermediate frequency signal into a digital output signal; comparing (415) the digital output signal with predefined thresholds comprising an upper threshold and a lower threshold; switching (417) the PMA 116 to a high gain state when an input of the VGA 118 is greater 310 than the upper threshold; and switching (419) the PMA 116 to a low gain state when an input of the VGA 118 is lower 312 than the lower threshold.

The method may further comprise down sampling the radio frequency output from the LNA 106 and performing signal processing of the radio frequency signal output from the LNA 106. Preferably, the RF AGC control loop 102 comprises a bandwidth of approximately 10 Hz. Moreover, the IF AGC control loop 104 preferably comprises a bandwidth of approximately 400 Hz. Also, the bandwidth of the RF AGC control loop 102 and the IF AGC control loop 104 may be programmable to obtain a tracking performance of the AGC loop circuit 100.

The automatic gain control loop circuit 100 provides stable tracking and good performance at adjacent interference conditions. The embodiments herein solve the problem of detecting large adjacent blockers. The AGC loop circuit 100 obtains very good linearity. The AGC loop circuit 100 with the RSSI process unit 108 detects a large adjacent blocker when the IF AGC unit 122 cannot, because the blocker would be filtered away by the time the signal gets to the demodulator power detector (i.e., RSSI process unit 108 detects the RF input power). Because the RF AGC loop 102 has a bandwidth of approximately 10 Hz and the IF AGC loop 104 has a bandwidth of 400 Hz, the two loops 102, 104 do not react/fight with each other. If the two loop bandwidths are sufficiently close enough, then the two loops 102, 104 might respond to the input changes at the same time which can cause unpredicted behavior and should be preferably avoided. The RF AGC unit 110 of the AGC loop circuit 100 acts to turn down the gain of the LNA 106 to prevent compression in the tuners (i.e., FIG. 1 represents the entire tuner block). Also, the embodiments are useful for the situation where no hardware resource is available on the chip. The RF AGC control unit 110 and RSSI process unit 108 could be implemented by software in the host side. The host reads RSSI information from LNA 106 output, RF AGC control unit 110, and RSSI process unit 108 and feeds the RF AGC control signal back to the LNA 106.

Figure 5:
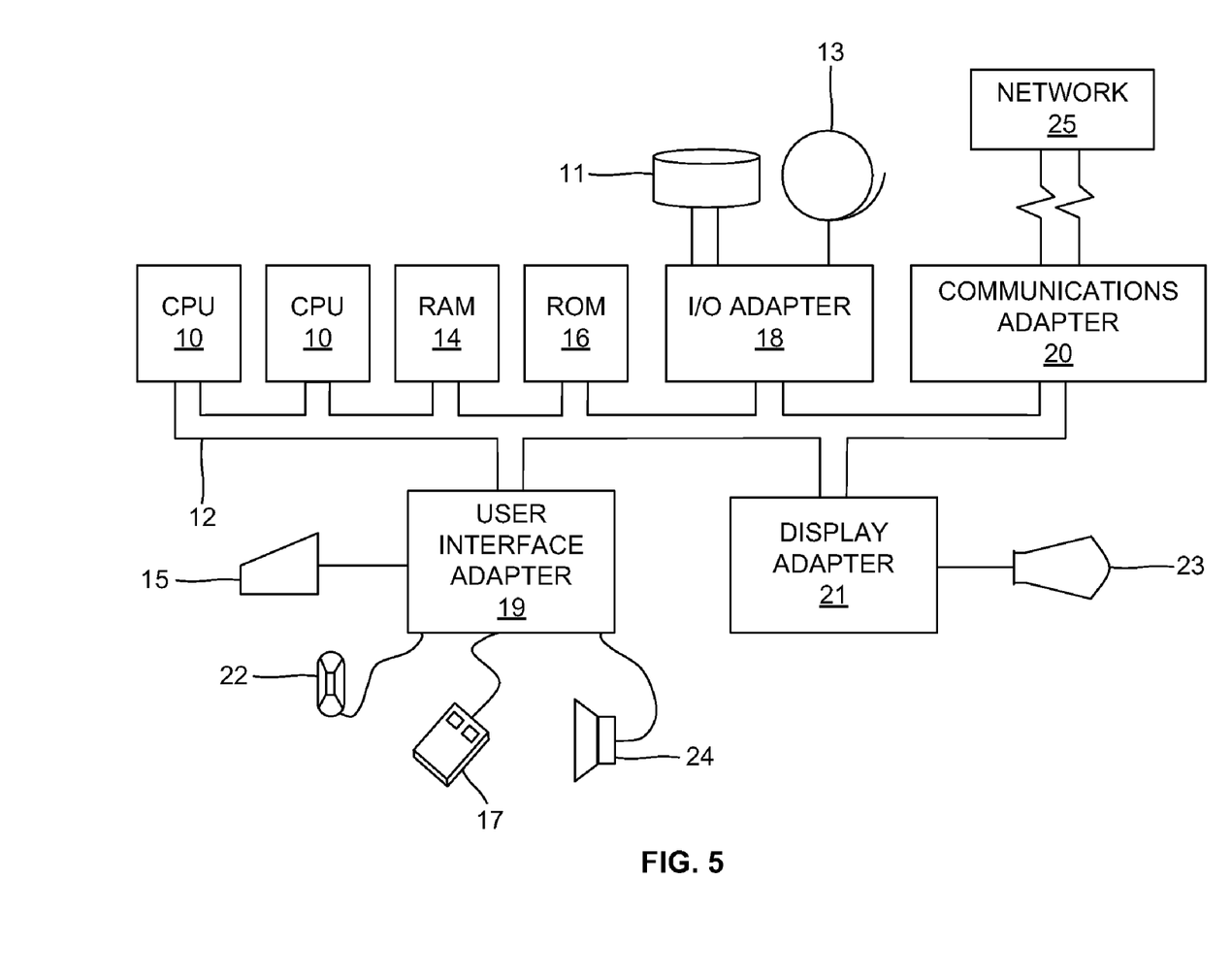
FIG. 5 is a schematic diagram illustrating a computer system used in accordance with the embodiments herein.

A representative hardware environment for practicing the embodiments herein is depicted in FIG. 5. This schematic drawing illustrates a hardware configuration of an information handling/computer system in accordance with the embodiments herein. The system comprises at least one processor or central processing unit (CPU) 10. The CPUs 10 are interconnected via system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the methodology of the embodiments herein. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

What is claimed is:

1. An automatic gain control (AGC) loop circuit comprising:
    a low noise amplifier (LNA) that amplifies a wideband radio frequency signal;
    a received signal strength indication (RSSI) unit that detects signals and blockers adjacent to said radio frequency signal, wherein said RSSI unit is coupled to said LNA;
    a radio frequency AGC control unit that lowers a gain of said radio frequency signal;
    a mixer that mixes a local oscillator (LO) signal with said radio frequency signal;
    a bandpass filter that filters additional signal blockers adjacent to said radio frequency signal received from said mixer;
    a post mixer amplifier (PMA) that amplifies an input signal of said PMA, wherein said PMA comprises a high gain state and low gain state;
    a variable gain amplifier (VGA) that continuously varies a gain of an intermediate frequency signal;
    an analog-to-digital converter (ADC) that converts said intermediate frequency signal into a digital output signal; and
    an intermediate frequency AGC control unit that feeds said digital output signal to said PMA and compares said digital output signal with predefined thresholds comprising an upper threshold and a lower threshold,
    wherein said PMA is switched to said high gain state when an input of said VGA is greater than said upper threshold, and
    wherein said PMA is switched to said low gain state when an input of said VGA is lower than said lower threshold.

2. The AGC loop circuit of claim 1, wherein said RSSI process unit down samples and performs signal processing of said radio frequency signal output from said LNA.

3. The AGC loop circuit of claim 1, further comprising a radio frequency AGC control loop comprising said LNA, said RSSI unit, and said radio frequency AGC control unit.

4. The AGC loop circuit of claim 1, further comprising an intermediate frequency AGC control loop comprising said bandpass filter, said PMA, said VGA, said ADC, and said intermediate frequency AGC control unit.

5. The AGC loop circuit of claim 3, wherein said radio frequency AGC control loop comprises a bandwidth of approximately 10 Hz.

6. The AGC loop circuit of claim 4, wherein said intermediate frequency AGC control loop comprises a bandwidth of approximately 400 Hz.

7. The AGC loop circuit of claim 5, wherein said bandwidth of said radio frequency AGC control loop is programmable to obtain a tracking performance of said AGC loop circuit.

8. The AGC loop circuit of claim 6, wherein said bandwidth of said intermediate frequency AGC control loop is programmable to obtain a tracking performance of said AGC loop circuit.

9. The AGC loop circuit of claim 1, wherein said radio frequency AGC control unit strengthens an output signal of said RSSI process unit, and wherein said RSSI process unit reduces compression in said radio frequency signal output from said LNA.

10. A mobile television (TV) receiver comprising an automatic gain controller (AGC), wherein said AGC comprises:
    a radio frequency (RF) AGC control loop comprising:
        a low noise amplifier (LNA) that amplifies a wideband radio frequency signal;
        a received signal strength indication (RSSI) unit that detects signals and blockers adjacent to said radio frequency signal, wherein said RSSI unit is coupled to said LNA; and
        a RF AGC control unit that lowers a gain of said radio frequency signal;
    a mixer that mixes a local oscillator (LO) signal with said radio frequency signal; and
    an intermediate frequency (IF) AGC control loop comprising:
        a bandpass filter that filters additional signal blockers adjacent to said radio frequency signal received from said mixer;
        a post mixer amplifier (PMA) that amplifies an input signal of said PMA, wherein said PMA comprises a high gain state and low gain state;
        a variable gain amplifier (VGA) that continuously varies a gain of an intermediate frequency signal;
        an analog-to-digital converter (ADC) that converts said intermediate frequency signal into a digital output signal; and
        an IF AGC control unit that feeds said digital output signal to said PMA and compares said digital output signal with predefined thresholds comprising an upper threshold and a lower threshold, wherein said PMA is switched to said high gain state when an input of said VGA is greater than said upper threshold, and wherein said PMA is switched to said low gain state when an input of said VGA is lower than said lower threshold.

11. The receiver of claim 10, wherein said RSSI process unit down samples and performs signal processing of said output signal of said LNA.

12. The receiver of claim 10, wherein said RF AGC control loop comprises a bandwidth of approximately 10 Hz.

13. The receiver of claim 10, wherein said IF AGC control loop comprises a bandwidth of approximately 400 Hz.

14. The receiver of claim 10, wherein said RF AGC control unit strengthens an output signal of said RSSI process unit, and wherein said RSSI process unit reduces compression in said output amplified signal of said LNA.

15. A method of providing stable tracking performance to an automatic gain control (AGC) loop circuit, said AGC loop circuit comprising (i) a radio frequency AGC control loop having a low noise amplifier (LNA) and a received signal strength indication (RSSI), and (ii) an intermediate frequency AGC control loop comprising a bandpass filter, a post mixer amplifier (PMA), and a variable gain amplifier (VGA), said method comprising:

amplifying a wideband radio frequency signal;

detecting signals and blockers adjacent to said radio frequency signal;

lowering a gain of said radio frequency signal;

mixing a local oscillator (LO) signal with said radio frequency signal;

shifting a frequency of said radio frequency signal from a radio frequency to an intermediate frequency;

continuously varying a gain of said intermediate frequency signal;

converting said intermediate frequency signal into a digital output signal;

comparing said digital output signal with predefined thresholds comprising an upper threshold and a lower threshold;

switching said PMA to a high gain state when an input of said VGA is greater than said upper threshold; and switching said PMA to a low gain state when an input of said VGA is lower than said lower threshold.

16. The method of claim 15, further comprising:

down sampling said radio frequency output from said LNA; and performing signal processing of said radio frequency signal output from said LNA.

17. The method of claim 15, wherein said radio frequency AGC control loop comprises a bandwidth of approximately 10 Hz.

18. The method of claim 15, wherein said intermediate frequency AGC control loop comprises a bandwidth of approximately 400 Hz.

19. The method of claim 17, wherein said bandwidth of said radio frequency AGC control loop is programmable to obtain a tracking performance of said AGC loop circuit.

20. The method of claim 15, wherein said bandwidth of said intermediate frequency AGC control loop is programmable to obtain a tracking performance of said AGC loop circuit.

* * * * *